United States Patent [19]

Okumura et al.

[11] Patent Number: 5,351,258
[45] Date of Patent: Sep. 27, 1994

[54] SEMICONDUCTOR LASER DEVICE

[75] Inventors: Toshiyuki Okumura, Tenri; Fumihiro Konushi, Nara; Tatsuya Morioka, Tenri; Narihito Matsumoto, Yokohama, all of Japan

[73] Assignee: Sharp Kabushiki Kaisha, Osaka, Japan

[21] Appl. No.: 99,206

[22] Filed: Jul. 29, 1993

[30] Foreign Application Priority Data

Jul. 30, 1992 [JP] Japan .................. 4-204026
Feb. 26, 1993 [JP] Japan .................. 5-39047

[51] Int. Cl.⁵ .................................................. H01S 3/19
[52] U.S. Cl. .......................................... 372/46; 372/45
[58] Field of Search ...................................... 372/46, 45

[56] References Cited

U.S. PATENT DOCUMENTS

| | | | |
|---|---|---|---|
| 4,845,724 | 7/1989 | Hayakawa et al. | 372/45 |
| 4,896,328 | 1/1990 | Sekiguchi et al. | 372/45 |
| 4,916,709 | 4/1990 | Ota et al. | 372/46 |
| 5,084,892 | 1/1992 | Hayakawa | 372/45 |

FOREIGN PATENT DOCUMENTS 61-194889 8/1986 Japan .
62-179788 8/1987 Japan .
63-122187 5/1988 Japan .
1-47028 10/1989 Japan .

Primary Examiner—Georgia Y. Epps
Attorney, Agent, or Firm—Morrison & Foerster

[57] ABSTRACT

A semiconductor laser device of the present invention includes: a semiconductor substrate having a top face and a bottom face; a multi-layered structure formed on the top face of the semiconductor substrate, the multi-layered structure including an active layer; a stripe-shaped ridge portion which is formed on a first region of a top face of the multi-layered structure and which extends along a cavity length direction; a current blocking layer which covers both side faces of the ridge portion and a second region of the top face of the multi-layered structure; a first electrode formed at least on a top face of the ridge portion; and a second electrode formed on the bottom face of the semiconductor substrate, wherein the current blocking layer includes an insulating film and a resin film formed on the insulating film.

12 Claims, 5 Drawing Sheets

SEMICONDUCTOR LASER DEVICE

BACKGROUND OF THE INVENTION

1. Field of the Invention

The present invention relates to an InGaAsP type semiconductor laser device used for optical communication.

2. Description of the Related Art

In the past, as InGaAsP type semiconductor laser devices for optical communication, etc., a Buried Crescent (BC)-laser diode or a Buried Hetero-structure (BH)-laser diode have been known.

A BC-laser diode is shown in FIG. 4. In this device, a V-shaped groove 47 is formed in an InP substrate 41. A current blocking layer 42 including an n-type InP layer 42a and a p-type InP layer 42b is formed on a portion of the InP substrate 41, excluding the V-shaped groove 47. The current blocking layer 42 has a pn junction. A lower cladding layer 43, an active layer 44, an upper cladding layer 45, and a cap layer 46 are successively formed on the current blocking layer 42 with the V-shaped groove 47.

A BH-laser diode is shown in FIG. 5. In this device, a lower cladding layer 53, an active layer 54, an upper cladding layer 55, and a cap layer 56 are successively formed on an InP substrate 51. The active layer 54, the upper cladding layer 55, and the cap layer 56 are formed in a stripe shape on the lower cladding layer 53 to provide a ridge portion. The ridge portion is buried with the current blocking layer 52 including an n-type InP layer 52a and a p-type InP layer 52b. The current blocking layer 52 has a pn junction.

There is the following problem in the above-mentioned structure in which an electric current is blocked by using a pn junction: A parasitic capacitance is increased due to a depletion layer formed around the pn junction, resulting in the increase in the capacitance of the device, making it difficult to realize a high-speed response to a high frequency electronic signal.

In order to realize a high-speed response, a semiconductor laser device with the following structure has been suggested.

A BH-laser diode in which a high-speed response is realized is shown in FIG. 6. In this device, grooves 67 are formed in a current blocking layer 62 including an n-type InP layer 62a and a p-type InP layer 62b so as to reach a substrate 61. $SiO_2$ films 68 are formed on the upper face of the current blocking layer 62 and on the inner surface of the grooves 67. In this figure, the reference numerals 63, 64, 65, and 66 denote a lower cladding layer, an active layer, an upper cladding layer, and a cap layer, respectively. In this structure, an electric current is blocked by the $SiO_2$ film 68 so as to be confined in the ridge portion. Thus, the capacitance of the device is reduced, compared with the case where the pn junction is used for current blocking, making possible a high-speed response. This high-speed response using the groove structure can also be applied to a device with a BC-laser diode.

In addition, a BH-laser diode as shown in FIG. 7 has been suggested. In this device, a p-type InP layer 70, an $SiO_2$ film 71, and a heat-resistant resin film with high electrical resistivity 72 are successively formed so as to bury a ridge portion including an active layer 74. In this structure, an electric current is blocked by using the $SiO_2$ film 71 and the heat-resistant resin film with high electrical resistivity 72 to be confined in the active layer 74, instead of using a pn junction. Moreover, the $SiO_2$ film 71 and the heat-resistant resin film with high electrical resistivity 72 are provided with a thickness of 2 $\mu$m or more. In this figure, the reference numerals 73, 75, 76, and 77 denote a lower cladding layer, an upper cladding layer, a cap layer, and a substrate, respectively.

Moreover, an AlGaAs type semiconductor laser device as shown in FIG. 8 has been suggested. In this device, a lower cladding layer 83, an active layer 84, an upper cladding layer 85, and a cap layer 86 are successively formed on a GaAs substrate 81. The upper portion of the upper cladding layer 85 and the cap layer 86 are formed in a stripe shape to provide a ridge portion. This ridge portion is buried with a heat resistant resin film with high electrical resistivity 87 so that the ridge portion and the heat-resistant resin film with high electrical resistivity 87 form a flat surface.

There are the following problems in the semiconductor laser devices with the above-mentioned structures.

In the semiconductor laser devices as shown in FIGS. 6 and 7, the active layer is formed in a stripe shape by etching. Because of this, the side faces of the active layer are exposed to air, resulting in the deterioration of the crystallinity of the active layer in the vicinity of the side faces of the ridge portion. Even after the ridge portion is buried with the current blocking layer 62, a plurality of non-radiative recombination centers are formed due to this deterioration of crystallinity. Thus, the reliability of the device is decreased.

In the semiconductor laser device as shown in FIG. 7, since the $SiO_2$ film 71 and the heat-resistant resin film with high electrical resistivity 72 are provided with a large thickness, the InP substrate 77, the $SiO_2$ film 71, and the heat-resistant resin film with high electrical resistivity 72 will have different thermal expansion coefficients. Because of this, large amounts of stress and strain are generated between the InP substrate 77, and the $SiO_2$ film 71 and the heat-resistant resin film with high electrical resistivity 72, rapidly deteriorating the device.

In the AlGaAs type semiconductor laser device as shown in FIG. 8, the upper face of the ridge portion and the heat-resistant resin film with high electrical resistivity 87 should form a flat surface so as to be bonded to a submount. Because of this, the thickness of the heat-resistant resin film with high electrical resistivity 87 is about 2 $\mu$m. In the case where this structure is applied to an InGaAsP type semiconductor laser device, great amounts of stress and strain are generated between the substrate 81 and the heat-resistant resin film with high electrical resistivity 87 due to the difference of thermal expansion coefficient thereof, rapidly deteriorating the device.

SUMMARY OF THE INVENTION

The semiconductor laser device of the present invention includes:
- a semiconductor substrate having a top face and a bottom face;
- a multi-layered structure formed on the top face of the semiconductor substrate, the multi-layered structure including an active layer;
- a stripe-shaped ridge portion which is formed on a first region of a top face of the multi-layered structure and which extends along a cavity length direction;

a current blocking layer which covers both side faces of the ridge portion and a second region of the top face of the multi-layered structure;

a first electrode formed at least on a top face of the ridge portion; and a second electrode formed on the bottom face of the semiconductor substrate, wherein the current blocking layer includes an insulating film and a resin film formed on the insulating film.

In one embodiment, the insulating film is made of silicon oxide, and the resin film is made of polyimide.

In another embodiment, the thickness of the resin film is 1.5 μm or less.

In another embodiment, the thickness of the insulating film is 0.2 μm or less.

In another embodiment, the multi-layered structure has a lower cladding layer, a lower guide layer provided between the lower cladding layer and the active layer, and an upper guide layer formed on the active layer.

In another embodiment, the active layer has a multi quantum-well structure including an InGaAs type barrier layer and a well layer.

In another embodiment, the ridge portion has an upper cladding layer and a contact layer formed on the upper cladding layer.

In another embodiment, the multi-layered structure has a lower cladding layer, a lower guide layer provided between the lower cladding layer and the active layer, an upper guide layer formed on the active layer, a first upper cladding layer formed on the upper guide layer, and an etching stop layer formed on the first upper cladding layer.

In another embodiment, the active layer has a multi quantum-well structure including an InGaAS type barrier layer and a well layer.

In another embodiment, the ridge portion has a second upper cladding layer and a contact layer formed on the second upper cladding layer.

Thus, the invention described herein makes possible the advantage of providing a semiconductor laser device with satisfactory reliability and a highspeed response which can be produced with good yield.

This and other advantages of the present invention will become apparent to those skilled in the art upon reading and understanding the following detailed description with reference to the accompanying figures.

DESCRIPTION OF THE PREFERRED EMBODIMENTS

Hereinafter, the preferred embodiment of the present invention will be described by way of illustrative examples with reference to the drawings.

EXAMPLE 1

Figure 1:
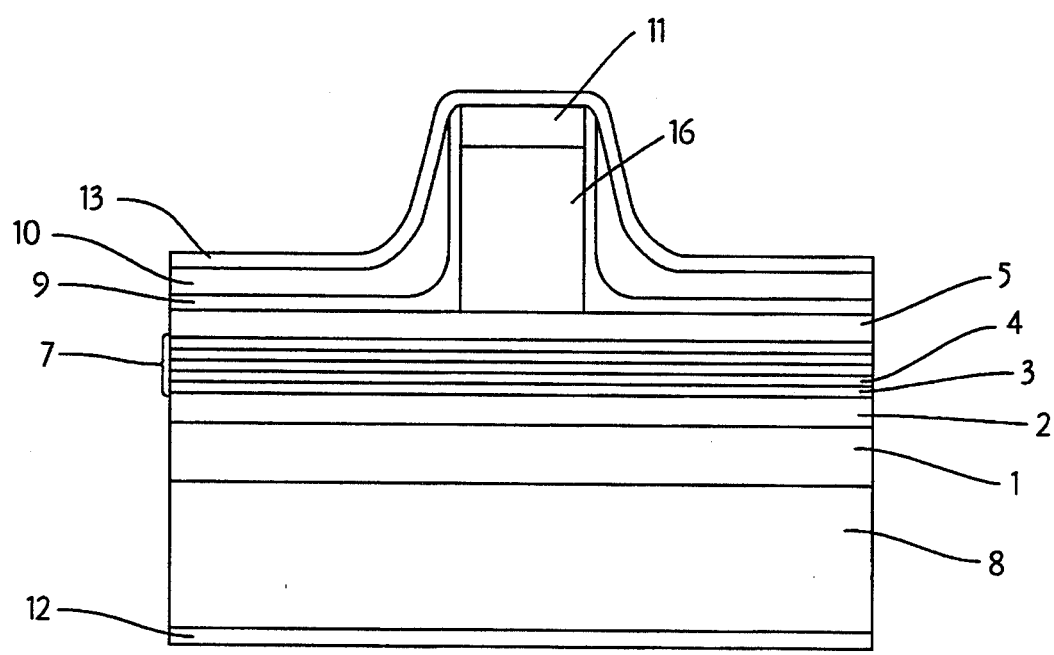
FIG. 1 is a cross-sectional view showing a semiconductor laser device of Example 1 according to the present invention.

FIG. 1 is a cross-sectional view showing a semiconductor laser device of Example 1. An n-type lower cladding layer 1, a lower guide layer 2, a multi quantum-well active layer 7 including quantum well layers 3 and barrier layers 4, an upper guide layer 5, a p-type upper cladding layer 6, and a p⁺-type cap layer 11 are successively grown on an n-type InP substrate 8 in this order by an epitaxial growth method. In Example 1, the multi quantum-well active layer 7 includes eight quantum well layers 3 and seven barrier layers 4. Then, only the p-type upper cladding layer 6 and p⁺-type cap layer 11 are formed in a stripe shape by photolithography and etching to provide a stripe-shaped ridge portion which extends along a cavity length direction. If an HCl type etchant is used for etching, the p-type upper cladding layer 6 can be selectively etched with the upper guide layer 5 remaining untouched. This is because the etchant (HCl) does not etch the upper guide layer 5. Next, an SiO₂ film 9 as an insulating film and a heat-resistant resin film with high electrical resistivity 10 are formed over an entire surface of the resulting multi-layered structure. In Example 1, a polyimide film is used as the heat-resistant resin film with high electrical resistivity 10. The SiO₂ film 9 can be deposited by chemical vapor deposition methods. The polyimide film can be formed by spin-coating methods. The thickness of the polyimide film 10 on the upper face of the ridge portion is smaller than that on the portions other than the upper face of the ridge portion. The polyimide film 10 on the upper face of the ridge portion is etched by ashing using oxygen plasma so that the polyimide film 10 remains only on the side faces of the ridge portion and on the upper face of the upper guide layer 5. After that, the SiO₂ film 9 on the upper face of the ridge portion is removed with an HF type etchant. Finally, an n-type electrode 12 is formed on the substrate 8 (on the opposite side of the growth surface), and a p-type electrode 13 is formed on the polyimide film 10 and the p⁺-type cap layer 11.

In Example 1, the composition and thickness of each semiconductor layer formed on the substrate 8 are, for example, as follows:

Lower cladding layer 1: n-type InP, 0.5 μm (thickness)

Lower guide layer 2: InGaAsP, $\lambda_g$=1.1 μm, 120 nm (thickness)

Quantum well layer 3: InGaAsP, $\lambda_g$=1.37 μm, 8 nm (thickness)

Barrier layer 4: InGaAsP, $\lambda_g = 1.1$ μm, 12 nm (thickness)

Upper guide layer 5: InGaAsP, $\lambda_g = 1.1$ μm, 120 nm (thickness)

p-type upper cladding layer 6: p-type InP, 2.0 μm (thickness)

p+-type cap layer 11: p+-type InGaAsP, $\lambda_g = 1.3$ μm, 0.5 μm (thickness)

Here, "$\lambda_g$" represents a wavelength corresponding to a forbidden band gap.

The semiconductor laser device fabricated as described above has a laser oscillation threshold current of 12 mA at room temperature, a differential efficiency of 0.5 mW/mA, a rise and fall time of optical output of 0.2 nsec. or less. The semiconductor laser device attains a high-speed response. Moreover, in such a semiconductor laser device, an optical output of 5 mW can be obtained with a small driving current of 50 mA even at a high temperature of 85° C.

Figure 8:
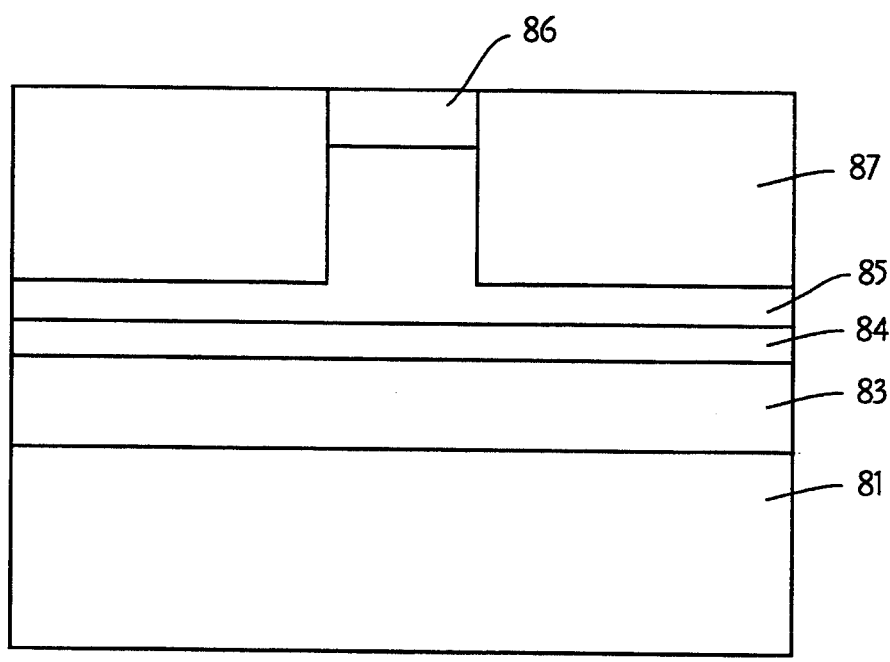
FIG. 8 is a cross-sectional view showing a conventional AlGaAs type semiconductor laser device using a heat-resistant resin film with high electrical resistivity.

In the conventional semiconductor laser device as shown in FIG. 8, the ridge portion in a stripe shape is formed by etching the upper cladding layer 85. In this case, the depth of the etched portion is adjusted by controlling the etching time, so that the depth varies depending on each device (i.e., the distance between the active layer 84 and the heat-resistant resin film with high electrical resistivity 87 varies depending on each device), resulting in the variation in the characteristics of each device, causing a decrease in production yield. On the other hand, in the semiconductor laser device of Example 1, the ridge portion in a stripe shape is formed by selectively etching only the p-type upper cladding layer 6 and the p+-type cap layer 11. In this structure, the distance between the active layer 7 and the SiO₂ film 9 (excluding the distance therebetween under the ridge portion) is determined by the thickness of the upper guide layer 5, providing excellent controllability. Because of this, the variation of device characteristics can be reduced, improving production yield. Moreover, even though the thickness of the SiO₂ film 9 and the polyimide film 10 are changed, the variation of device characteristics can be reduced, and a semiconductor laser device can be produced with good yield.

Figure 2A:
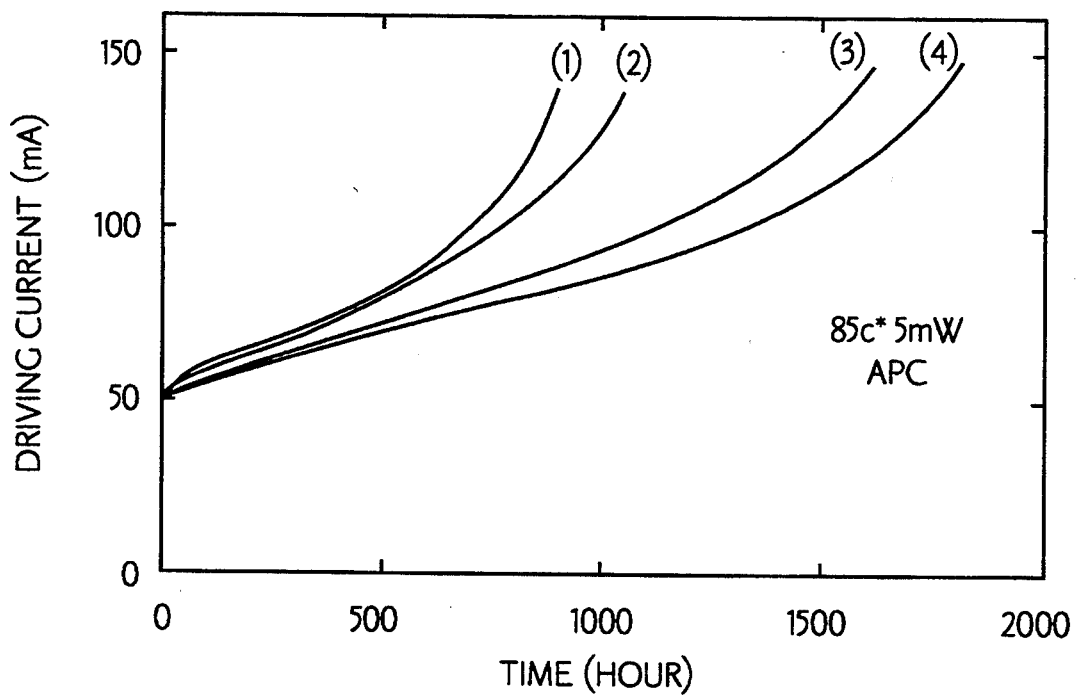
FIG. 2A is a diagram showing the results of a reliability test of a semiconductor laser device produced by varying the thickness of an SiO₂ film and a polyimide film.

A reliability test was conducted by using semiconductor laser devices having a different thickness of the SiO₂ film 9 and the polyimide film 10 as shown in the following (1) to (4). The results are shown in FIG. 2A.

(1) No SiO₂ film 9, Polyimide film 10 with a thickness of 2 μm.

(2) No SiO₂ film 9, Polyimide film 10 with a thickness of 1 μm.

(3) SiO₂ film 9 with a thickness of 0.5 μm, Polyimide film 10 with a thickness of 1 μm.

(4) SiO₂ film 9 with a thickness of 0.2 μm, Polyimide film 10 with a thickness of 2 μm.

As is understood from this figure, in the cases where only the polyimide film 10 is provided (i.e., (1) and (2)), the thermal stress and strain is so great that the reliability of the semiconductor laser device is low. On the other hand, in the cases where the SiO₂ film 9 is provided (i.e., (3) and (4)), the thermal stress and strain is alleviated, so that the reliability of the semiconductor laser device can be increased. This is because the SiO₂ film 9 has a small volume elasticity coefficient and alleviates the thermal stress and strain of the polyimide film 10. However, even though the SiO₂ film 9 is provided, in the case where the thickness of the SiO₂ film 9 is large (i.e., (3)) or in the case where the thickness of the polyimide film 10 is large (i.e., (4)), the reliability of the device is likely to be lowered due to the thermal stress and strain. Further experiments found that the most excellent reliability is obtained when the SiO₂ film 9 with a thickness of 0.2 μm or less and the polyimide film 10 with a thickness of 1.5 μm or less are used.

Figure 2B:
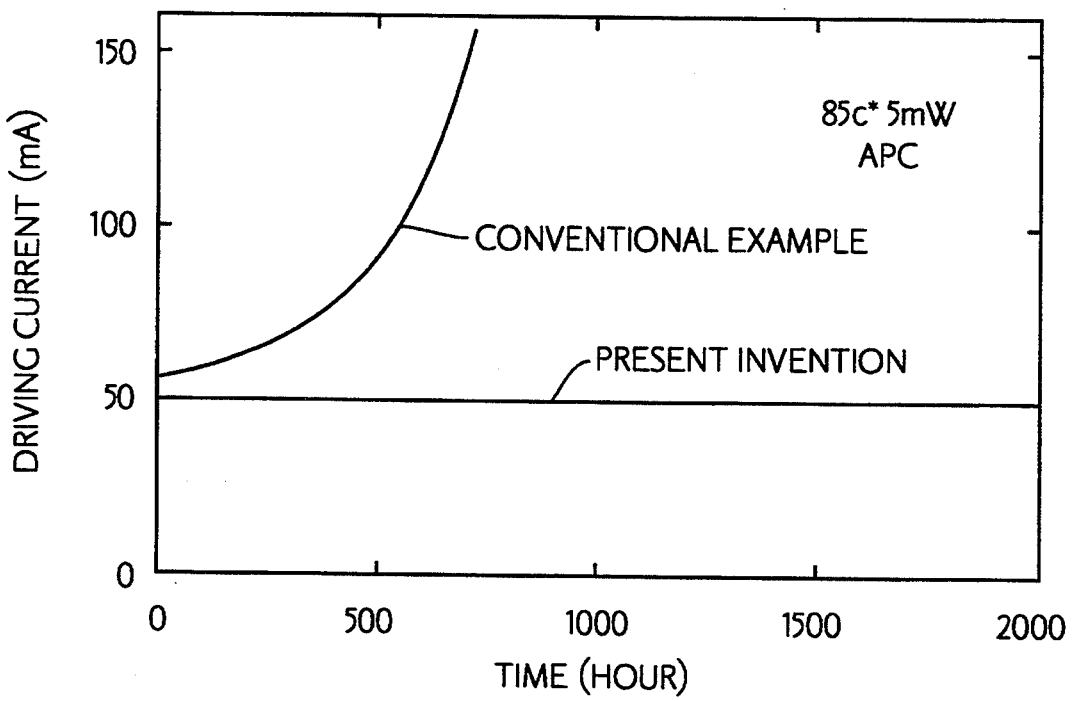
FIG. 2B is a diagram showing the results of a reliability test of the semiconductor laser device of Example 1 according to the present invention and a conventional BH-laser diode.
Figure 6:
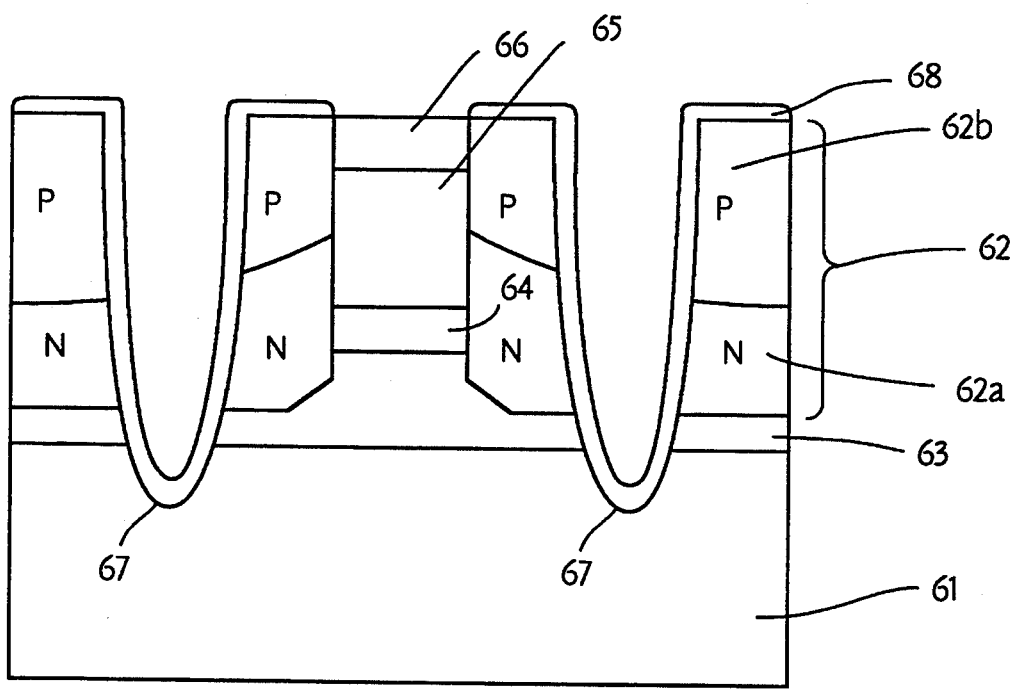
FIG. 6 is a cross-sectional view showing a conventional BH-laser diode in which grooves are formed in a current blocking layer so as to reach a substrate and an electric current is blocked by SiO₂ films formed in the grooves.
Figure 7:
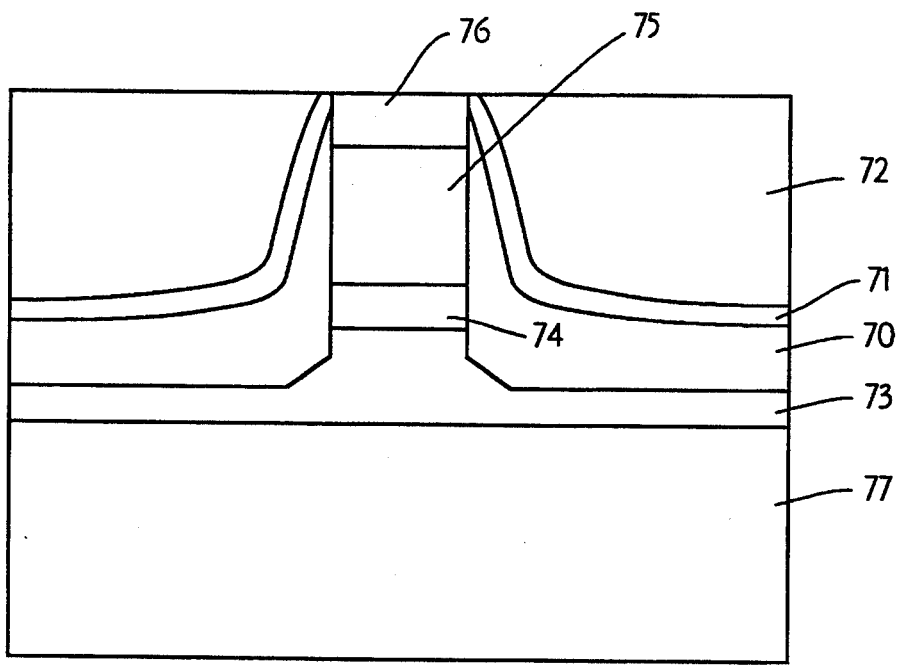
FIG. 7 is a cross-sectional view showing a conventional BH-laser diode using a p-type InP layer, an SiO₂ film, and a heat-resistant resin film with high electrical resistivity as a burying layer.

FIG. 2B shows the results of a reliability test conducted by using the semiconductor laser device of Example 1 and the conventional BH-laser diode shown in FIG. 6. In this test, the SiO₂ film 9 with a thickness of 0.2 μm and the polyimide film 10 with a thickness of 1 μm are used in the semiconductor laser device of Example 1. As is understood from FIG. 2B, in the semiconductor laser device of Example 1, a driving current hardly increases at an optical output of 5 mW and a temperature of 85° C. even after the elapse of 2000 hours. On the other hand, in the conventional semiconductor laser device, the driving current increases with the time. Thus, the semiconductor laser device of the present invention has excellent reliability.

EXAMPLE 2

Figure 3:
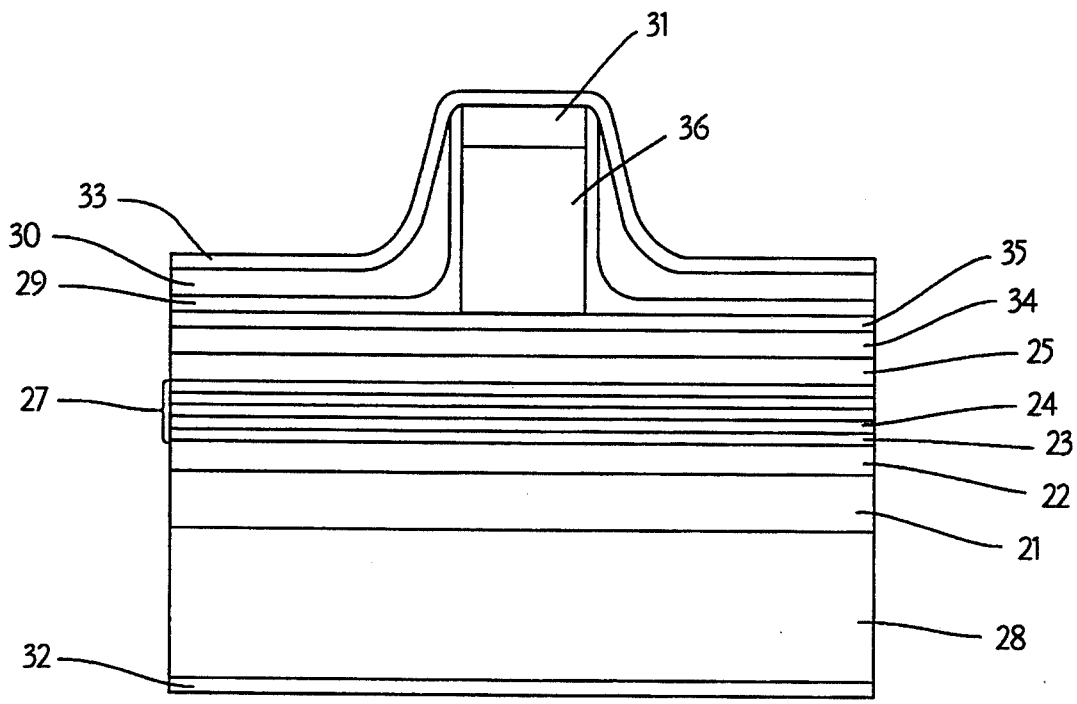
FIG. 3 is cross-sectional view showing a semiconductor layer device of Example 2 according to the present invention.
Figure 4:
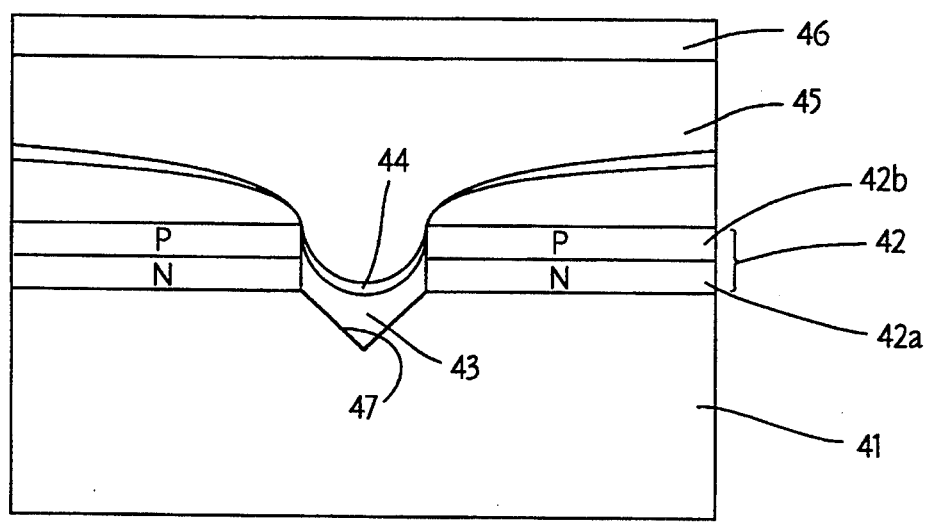
FIG. 4 is a cross-sectional view showing a conventional BC-laser diode.
Figure 5:
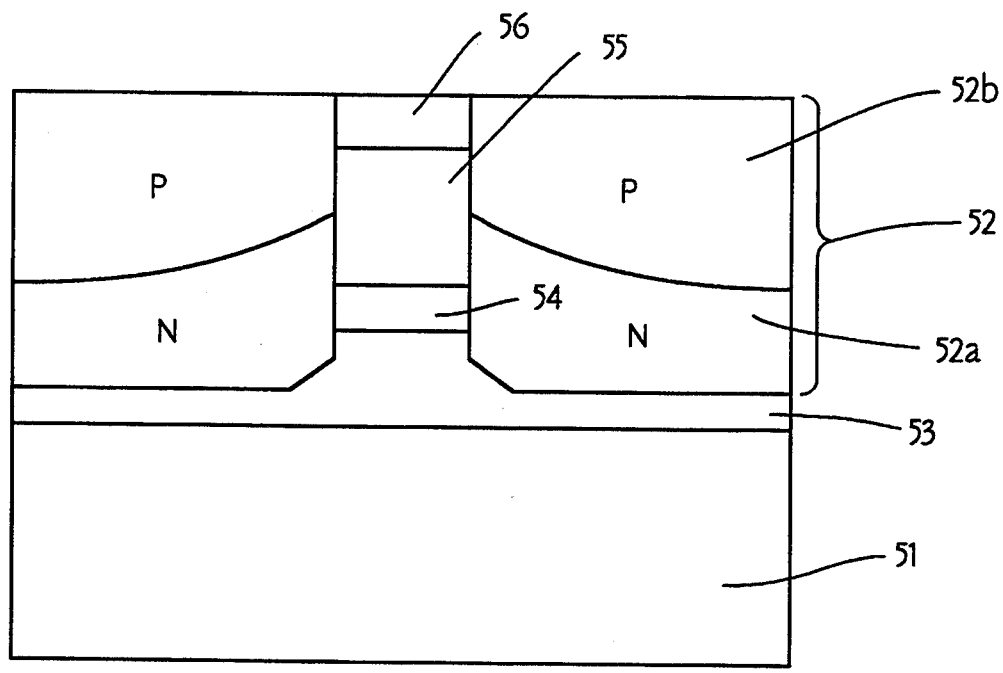
FIG. 5 is a cross-sectional view showing a conventional BH-laser diode.

FIG. 3 is a cross-sectional view showing a semiconductor laser device of Example 2. This semiconductor laser device is manufactured in the following manner:

An n-type lower cladding layer 21, a lower guide layer 22, a multi quantum-well active layer 27 including quantum well layers 23 and barrier layers 24, an upper guide layer 25, a first p-type upper cladding layer 34, an etching stop layer 35, a second p-type upper cladding layer 36, and a p+-cap layer 31 are successively grown on an n-type InP substrate 28 by a general epitaxial growth method. In the present example, the multi quantum-well active layer 27 includes eight quantum well layers 23 and seven barrier layers 24. Then, only the second p-type upper cladding layer 36 and the p+-cap layer 31 are formed in a stripe shape to provide a ridge portion. If an HCl type etchant is used for etching, the second p-type upper cladding layer 36 can be selectively etched with the etching stop layer 35 remaining untouched. Next, the SiO₂ film 29 as an insulating film and the heat-resistant resin film with high electrical resistivity 30 are formed on the entire surface of the resulting multilayered structure. In the present example, a polyimide film is used as the heat-resistant resin film with high electrical resistivity 30. The thickness of the polyimide film 30 on the upper face of the ridge portion is smaller than that on the portions other than the upper face of the ridge portion. The polyimide film 30 on the upper face of the ridge portion is etched by ashing using oxygen plasma so that the polyimide film 30 remains only on the side faces of the ridge portion and on the upper face of the etching stop layer 35. After that, the SiO₂ film 29 on the upper face of the ridge portion is removed with an HF type etchant. Finally, an n-type electrode 32 is formed on the bottom face of the substrate 28 (on the opposite side of the growth surface), and a p-type electrode 33 is formed on the polyimide film 30 and the p+-cap layer 31 by sputtering, respectively.

In Example 2, the structure other than the first p-type upper cladding layer 34, the etching stop layer 35, and the second p-type upper cladding layer 36 is the same as that of Example 1. The first p-type upper cladding layer 34 is made of p-type InP and has a thickness of 0.2 μm. The etching stop layer 35 is made of p-type InGaAsP, and has $\lambda_g = 1.1$ μm and a thickness of 100 nm. The second p-type upper cladding layer 36 is made of p-type InP and has a thickness of 2.0 μm.

In the semiconductor laser device manufactured as described above, the light-emitting region is positioned further away from the SiO$_2$ film 29, compared with Example 1, so that the reliability of the device is farther improved. In addition, the size of a farfield pattern of an emitted light can be regulated by varying the thickness of the first p-type upper cladding layer 34 and the etching stop layer 35. Because of this, in the case where the semiconductor laser device is coupled with an optical fiber through a lens, the amount of light which is incident upon the lens can be made large. Thus, the coupling efficiency between the semiconductor laser device and the lens becomes satisfactory.

In Examples 1 and 2, the guide layer has a homogeneous composition in the film thickness direction. The present invention is not limited thereto. Namely, a Graded Index-Separate Confinement Hetero-structure (GRIN-SCH) (in which the composition of the guide layer is varied in the film thickness direction) can be used in the present invention.

In the semiconductor laser device of the present invention, an active layer is not exposed to air, so that there is no possibility of deteriorating the crystallinity of the active layer. Thus, the device is excellent in reliability. In addition, the capacitance of the device is reduced by using an insulating film and a heat-resistant resin film with high electrical resistivity as a current blocking layer. The influence of stress and strain on an InP substrate can be decreased by making the thickness of the insulating film and the heat-resistant resin film with high electrical resistivity small. Herein, the term "the capacitance of the device" means the capacitance of the overall semiconductor laser device including the capacitance of a dielectric which is to be a current blocking layer. This structure can be formed by one crystal growth step, simplifying the production process. Thus, according to the present invention, a semiconductor laser device with satisfactory reliability and a high-speed response can be produced with good yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device comprising:
    a semiconductor substrate having a top face and a bottom face;
    a multi-layered structure formed on the top face of the semiconductor substrate, the multi-layered structure including an active layer;
    a stripe-shaped ridge portion which is formed on a first region of a top face of the multi-layered structure and which extends along a cavity length direction;
    a current blocking layer which covers both side faces of the ridge portion and a second region of the top face of the multi-layered structure;
    a first electrode formed at least on a top face of the ridge portion; and
    a second electrode formed on the bottom face of the semiconductor substrate,
    wherein the current blocking layer includes an insulating film and a resin film formed on the insulating film.

2. A semiconductor laser device according to claim 1, wherein the insulating film is made of silicon oxide, and the resin film is made of polyimide.

3. A semiconductor laser device according to claim 1, wherein the thickness of the resin film is 1.5 μm or less.

4. A semiconductor laser device according to claim 2, wherein the thickness of the resin film is 1.5 μm or less.

5. A semiconductor laser device according to claim 1, wherein the thickness of the insulating film is 0.2 μm or less.

6. A semiconductor laser device according to claim 2, wherein the thickness of the insulating film is 0.2 μm or less.

7. A semiconductor laser device according to claim 1, wherein the multi-layered structure has a lower cladding layer, a lower guide layer provided between the lower cladding layer and the active layer, and an upper guide layer formed on the active layer.

8. A semiconductor laser device according to claim 7, wherein the active layer has a multi quantum-well structure including an InGaAs type barrier layer and a well layer.

9. A semiconductor laser device according to claim 8, wherein the ridge portion has an upper cladding layer and a contact layer formed on the upper cladding layer.

10. A semiconductor laser device according to claim 1, wherein the multi-layered structure has a lower cladding layer, a lower guide layer provided between the lower cladding layer and the active layer, an upper guide layer formed on the active layer, a first upper cladding layer formed on the upper guide layer, and an etching stop layer formed on the first upper cladding layer.

11. A semiconductor laser device according to claim 10, wherein the active layer has a multi quantum-well structure including an InGaAS type barrier layer and a well layer.

12. A semiconductor laser device according to claim 11, wherein the ridge portion has a second upper cladding layer and a contact layer formed on the second upper cladding layer.

* * * * *

UNITED STATES PATENT AND TRADEMARK OFFICE
CERTIFICATE OF CORRECTION

PATENT NO. : 5,351,258
DATED : September 27, 1994
INVENTOR(S) : Toshiyuki Okumura, et al.

It is certified that error appears in the above-indentified patent and that said Letters Patent is hereby corrected as shown below:

In the Drawings:

FIG. 2A: parameter "85C* 5mW" should read --85°C 5mW--;
FIG. 2A: parameter "85C* 5mW" should read --85°C 5mW--.

Signed and Sealed this

Seventeenth Day of January, 1995

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,351,258
DATED : September 27, 1994
INVENTOR(S) : Toshiyuki Okumura, et al.

It is certified that error appears in the above-indentified patent and that said Letters Patent is hereby corrected as shown below:

On the Title Page:

item [73] is: "Sharp Kabushiki Kaisha, Osaka, Japan"

item [73] should read:
"Sharp Kabushiki Kaisha, Osaka, Japan,
The Furukawa Electric Co., Ltd., Tokyo,
Japan"

Signed and Sealed this

Thirteenth Day of June, 1995

Attest:

BRUCE LEHMAN

*Attesting Officer*           *Commissioner of Patents and Trademarks*